(12) United States Patent
Herrault (10) Patent No.: US 10,957,537 B2
(45) Date of Patent: Mar. 23, 2021

(54) METHODS TO DESIGN AND UNIFORMLY CO-FABRICATE SMALL VIAS AND LARGE CAVITIES THROUGH A SUBSTRATE

(71) Applicant: HRL Laboratories, LLC, Malibu, CA (US)

(72) Inventor: Florian G. Herrault, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/557,811

(22) Filed: Aug. 30, 2019

(65) Prior Publication Data
US 2020/0152465 A1    May 14, 2020

Related U.S. Application Data

(60) Provisional application No. 62/758,825, filed on Nov. 12, 2018.

(51) Int. Cl.
  *H01L 21/04*    (2006.01)
  *H01L 21/683*   (2006.01)
  (Continued)

(52) U.S. Cl.
  CPC ........ *H01L 21/0475* (2013.01); *H01L 21/308* (2013.01); *H01L 21/3065* (2013.01); *H01L 21/6835* (2013.01); *H01L 23/49827* (2013.01)

(58) Field of Classification Search
  CPC ............... H01L 21/0475; H01L 21/308; H01L 21/3065; H01L 21/6835; H01L 21/4803;
  (Continued)

(56) References Cited

U.S. PATENT DOCUMENTS

| 8,617,927 B1 | 12/2013 | Margomenos |
| 9,214,404 B1 | 12/2015 | Margomenos |

(Continued)

FOREIGN PATENT DOCUMENTS

KR    10-2013-0117329    10/2013

OTHER PUBLICATIONS

From U.S. Appl. No. 16/158,212 (now published as US 2019-0198449 A1), Office Action dated Jan. 16, 2020.

(Continued)

*Primary Examiner* — Lan Vinh
(74) *Attorney, Agent, or Firm* — Ladas & Parry (57) ABSTRACT

A method of forming concurrently openings in a substrate or wafer or a portion of substrate or wafer openings therein at least one of the openings has a relatively high aspect ratio and another one of the openings has a relatively low aspect ratio, the method comprising: bonding the substrate or wafer or a portion of substrate or wafer to a carrier substrate; forming a ring trench in the substrate or wafer or in a portion of the substrate or wafer, the ring trench having an outer perimeter that corresponds an outer perimeter of the another one of the openings having said relatively low aspect ratio and having an inner perimeter spaced from the outer perimeter by a predetermined distance; forming an opening in said substrate or wafer or in a portion of substrate or wafer having said high aspect ratio concurrently with the forming of the ring trench; and separating the substrate or wafer or in a portion of the substrate or wafer from the carrier substrate.

27 Claims, 9 Drawing Sheets

(51) Int. Cl.
  *H01L 21/308* (2006.01)
  *H01L 21/3065* (2006.01)
  *H01L 23/498* (2006.01)

(58) Field of Classification Search
  CPC .......... H01L 21/486; H01L 2221/6834; H01L 23/49822; H01L 23/49827; H01L 23/5389; H01L 24/00; H01L 25/00
  USPC ....... 438/700, 706, 710, 712, 714, 718, 720, 438/723, 719; 216/33, 34, 35
  See application file for complete search history.

(56) References Cited

U.S. PATENT DOCUMENTS

| | | |
|---|---|---|
| 9,337,124 B1 | 5/2016 | Herrault |
| 9,385,083 B1 | 7/2016 | Herrault |
| 9,508,652 B1 | 11/2016 | Herrault |
| 9,837,372 B1 | 12/2017 | Herrault |
| 2002/0110952 A1 | 8/2002 | Gris |
| 2006/0105496 A1 | 5/2006 | Chen |
| 2007/0025092 A1 | 2/2007 | Lee |
| 2008/0224320 A1 | 9/2008 | Palmade |
| 2011/0140216 A1 | 6/2011 | Qu |
| 2011/0266569 A1 | 11/2011 | Basin |
| 2012/0037935 A1 | 2/2012 | Yang |
| 2013/0168803 A1* | 7/2013 | Haddad .............. H01L 21/6835 257/507 |
| 2014/0021610 A1 | 1/2014 | Von Koblinski |
| 2014/0203239 A1 | 7/2014 | Schubert |
| 2016/0111616 A1* | 4/2016 | Margalit ............... H01L 33/483 257/98 |
| 2016/0293557 A1 | 10/2016 | Topak |
| 2016/0308270 A1* | 10/2016 | Ding .................... H01Q 1/2283 |
| 2016/0329232 A1* | 11/2016 | Golda ..................... B32B 38/18 |
| 2017/0363589 A1* | 12/2017 | Kumar ................ G01N 33/497 |
| 2018/0019178 A1 | 1/2018 | Lin |
| 2018/0148328 A1 | 5/2018 | Agache |
| 2019/0198449 A1 | 6/2019 | Herrault |

OTHER PUBLICATIONS

From U.S. Appl. No. 16/158,212 (now published as US 2019-0198449 A1), Office Action dated Jul. 26, 2019.
From U.S. Appl. No. 16/158,212 (now published as US 2019-0198449 A1), Office Action dated Feb. 16, 2020.
PCT International Search Report and Written Opinion from PCT/US2019/050384 dated Jan. 20, 2020.
U.S. Appl. No. 16/158,212, Herrault, filed Oct. 11, 2018.
PCT International Search Report and Written Opinion from PCT/US2018/055516 dated Feb. 1, 2019.
Chinoy, P. et al., "Manufacture of low-loss microwave circuits using HMIC technology," 1994 IEEE MTT-S International Microwave Symposium Digest (Cat. No. 94CH3389-4), San Diego, CA, USA, 1994, pp. 1137-1140 vol. 2. doi: 10.1109/MWSYM.1994.335544.
PCT International Preliminary Report on Patentability (Chapter I) with Written Opinion from PCT/US2018/055516 dated Jun. 23, 2020.
From U.S. Appl. No. 16/158,212 (now published as US 2019-0198449 A1 , Office Action dated Jul. 29, 2020.

* cited by examiner

Fig. 9A
Wafer on carrier (optional – and can be done first or after mask patterning)

Fig. 9B
Etch mask fabrication (e. g., resist or metal mask)

Fig. 9C
Wafer etching (e. g., Reactive Ion Etching)

Fig. 9D
Wafer release from carrier and resist mask removal.

Fig. 9B-1

Top view of a etch mask to etch concurrently large-area cavities with small high-aspect ratio vias

Fig. 9D-1

Top view after wafer etch and release. The large cavities are formed concurrently with the the small vias

METHODS TO DESIGN AND UNIFORMLY CO-FABRICATE SMALL VIAS AND LARGE CAVITIES THROUGH A SUBSTRATE

CROSS REFERENCE TO RELATED APPLICATIONS

This application claims the benefit of US Provisional Patent Application No. 62/758,825 filed 12 Nov. 2018, the disclosure of which is hereby incorporated by reference. This application is also related to U.S. application Ser. No. 16/158,212, filed on 11 Oct. 2018 the disclosure of which is also hereby incorporated by reference.

STATEMENT REGARDING FEDERALLY SPONSORED RESEARCH OR DEVELOPMENT

This invention was made with Government support under contract number FA8650-13-C-7324. The Government has certain rights in the invention.

TECHNICAL FIELD

This presentation relates to a method to efficiently design and fabricate small vias (for example having a 30 μm diameter) and large cavities (having lateral dimensions 3 to 100 times the diameter of the vias) using a same etching process. Embodiments of this presentation can be used to manufacture the carrier wafer comprising an integrated circuit and a through-wafer cavity described in U.S. patent application Ser. No. 16/158,212 filed 11 Oct. 2018 which is incorporated by reference herein as though fully set forth.

BACKGROUND

There exists a need in the art for manufacturing a carrier wafer comprising an integrated circuit and a through-wafer cavity, such as described for example in US application Ser. No. 16/158,212, which discloses Metal-Embedded Chip Assembly for Microwave Integrated Circuits (MECAMIC) devices and processes and allows embedding at the wafer level microelectronics transistor chiplets into a wafer that has pre-fabricated interconnects and integrated circuits such as passive components. In other words, a MECAMIC device decoupling the front end fabrication of the device from the back-end interconnect fabrication of the device. This allows for much a faster manufacturing of the device, at lower cost, and a scaling up of transistor technologies to circuits without cost and cycle time burden.

The at least one integrated circuit of a MECAMIC device, formed on an upper surface of the carrier wafer may require a through-wafer via for electrical connection to the lower surface of the carrier wafer. Such vias have generally a small diameter (of the order of a few tens of microns) and a high aspect ratio (they are higher than they are wide). On another hand, the through-wafer cavities of the carrier wafer are often much wider than they are high, and have a low aspect ratio. It is well known that an etching process may have different etching rates in the lateral and vertical directions.

Figure 1:
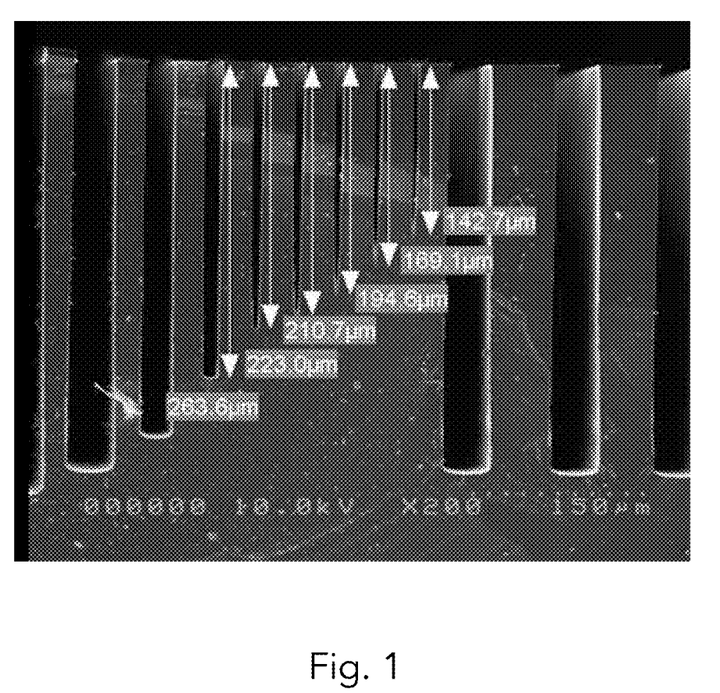
FIG. 1 is a Scanning Electron Microscope (SEM) depiction showing an example of width-dependent etch rates.

FIG. 1 is a SEM depicted an example of width-dependent etch rates—this is a vertical cross section of a silicon wafer etched with patterns of different widths. The etch rate between 60 μm wide and 10 μm patterns (6× ratio) is 2×. The figure highlights the challenges faced by forming simultaneous features of different sizes. In this image (a SEM cross section of an DRIE etched silicon wafer), the trenches range from 10 to 60 μm wide and the etch depth varies by 2×.

As is illustrated in FIG. 1, for a given etching process, a deeper etch (and hence a longer etch time) results means a wider etch. Thus, there exists a technical problem in the prior art in that two distinct etching processes have been required for etching, in a common carrier wafer, vias which are relatively narrow and thus have a relatively high aspect ratio and cavities which are relatively wide and thus having a relatively low aspect ratio. Indeed using the same etching process to etch both low aspect ratio cavities and highaspect ratio vias leads either to an incomplete depth etch of the vias, or to an over-etch of the cavities, laterally, which is likely to lead to detrimentally damaging frontside patterns of the wafer; and/or to detrimentally affecting the planarity of the frontside of the wafer. Alternatively, using multiple etching processes is time consuming and costly.

There exists a need for an efficient method for etching in a given carrier wafer, with a single etching process, vias having a high aspect ratio and cavities having a low aspect ratio.

BRIEF DESCRIPTION OF THE INVENTION

This disclosure relates to a process that allows using a single etch process to etch in a same wafer high aspect ratio vias and low aspect ratio through-wafer cavities.

An embodiment of this presentation relates to a method comprising: providing a wafer comprising: a substrate having a substrate top surface and a substrate bottom surface; an integrated circuit formed in said substrate and comprising at least one conductive line; and a top layer covering said substrate top surface; etching, through said top layer and down to said substrate top surface, a first ring trench that defines a predetermined perimeter; attaching a carrier wafer to a top surface of said top layer; etching through the substrate at least: a second ring trench having said predetermined perimeter, that extends from said substrate bottom surface to said first ring trench, thus forming a portion of the wafer inside said perimeter that is attached to said carrier wafer only; and a first via that extends from said substrate bottom surface to said at least one conductive line; and removing said carrier wafer, along with said portion of the wafer inside said perimeter.

According to an embodiment of this presentation, the method comprises thinning the substrate on the side of said substrate bottom surface before etching said second ring trench and first via.

According to an embodiment of this presentation, the method comprises forming an etching mask on said substrate bottom surface before etching said second ring trench and first via.

According to an embodiment of this presentation, the method comprises filling said first via with a conductive material.

According to an embodiment of this presentation, said first via has a width and a height, and said perimeter has a length, a width and a height; the length and the width of the perimeter being each larger than twice the width of said first via.

According to an embodiment of this presentation, the width of said first via is at most half the height of said first via.

According to an embodiment of this presentation, at least one of the length and the width of the perimeter is comprised between 5 times and 100 times the width of said first via.

According to an embodiment of this presentation, the width of said first via is 30 micrometer.

According to an embodiment of this presentation, the method comprises conducting said etching through the substrate using plasma dry etch.

According to an embodiment of this presentation, said substrate is a SiC substrate.

Another embodiment of this presentation relates to a method comprising: providing a wafer with: a substrate having a substrate top surface and a substrate bottom surface; an integrated circuit formed on said substrate top surface and comprising at least one conductive line; attaching a carrier wafer to a top surface of said top layer; etching through the substrate at least: a first ring trench having a predetermined perimeter, that extends from said substrate bottom surface to said substrate top surface, thus forming a portion of the wafer inside said perimeter that is attached to said carrier wafer only; and a first via that extends from said substrate bottom surface to said at least one conductive line; and removing said carrier wafer, along with said portion of the wafer inside said perimeter.

According to an embodiment of this presentation, a top layer covers said substrate top surface; the method comprising, before said attaching a carrier wafer to a top surface of said top layer, etching through said top layer and down to said substrate top surface, a second ring trench above said predetermined perimeter.

According to an embodiment of this presentation, the method comprises thinning the substrate on the side of said substrate bottom surface before etching said first ring trench and first via.

According to an embodiment of this presentation, the method comprises forming an etching mask on said substrate bottom surface before etching said first ring trench and first via.

According to an embodiment of this presentation said first via has a width and a height, and wherein said perimeter has a length, a width and a height; the length and the width of the perimeter being each larger than twice the width of said first via.

Another embodiment of this presentation relates to a method comprising: providing a wafer with: a substrate having a substrate top surface and a substrate bottom surface; and an integrated circuit formed on said substrate top surface and comprising at least one conductive line; attaching a carrier wafer to a top surface of said top layer; etching through the substrate at least a first ring trench having a predetermined perimeter, that extends from said substrate bottom surface to said substrate top surface, thus forming a portion of the wafer inside said perimeter that is attached to said carrier wafer only; and removing said carrier wafer, along with said portion of the wafer inside said perimeter.

According to an embodiment of this presentation, the method comprises, at the same time as said etching a first ring trench through the substrate, etching through the substrate a first via that extends from said substrate bottom surface to said at least one conductive line.

According to an embodiment of this presentation, a top layer covers said substrate top surface; and the method comprises, before said attaching a carrier wafer to a top surface of said top layer, etching through said top layer and down to said substrate top surface, a second ring trench above said predetermined perimeter.

According to an embodiment of this presentation, the method comprises thinning the substrate on the side of said substrate bottom surface before etching said first ring trench and first via.

According to an embodiment of this presentation, the method comprises forming an etching mask on said substrate bottom surface before etching said first ring trench and first via.

According to an embodiment of this presentation, the method comprises forming concurrently, in a substrate or wafer or a portion of a substrate or wafer, openings therein at least one of the openings has a relatively high aspect ratio and another one of the openings has a relatively low aspect ratio, the method comprising: bonding said substrate or wafer or a portion of the substrate or wafer to a carrier substrate; forming a ring trench in said substrate or wafer or in a portion of the substrate or wafer, the ring trench having an outer perimeter that corresponds to an outer perimeter of the another one of the openings having said relatively low aspect ratio and having an inner perimeter spaced from the outer perimeter by a predetermined distance or predetermined distances; forming an opening in said substrate or wafer or in a portion of substrate or wafer having said high aspect ratio concurrently with said forming of said ring trench; and separating said substrate or wafer or in a portion of substrate or wafer from said carrier substrate.

BRIEF DESCRIPTION OF THE DRAWINGS

FIGS. 9A-9D, 9B-1 and 9D-1 illustrate an embodiment of a process flow to create small vias and large cavities concurrently in an arbitrary semiconductor wafer.

DETAILED DESCRIPTION

The following description is presented to enable one of ordinary skill in the art to make and use the teachings of this presentation and to incorporate them in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of embodiments of this presentation. However, it will be apparent to one skilled in the art that such embodiments may be practiced without necessarily being limited to these specific details.

All the features disclosed in this presentation, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

HRL Laboratories LLC of Malibu, California has pioneered a transistor level integration technology called "Metal Embedded Chip Assembly for Microwave Integrated Circuits" (MECAMIC). A conceptual drawing (cross section of a MECAMIC device) is shown for reference in FIG. 2. This presentation addresses designs and fabrication methods to etch, in a single etch process, both high aspect-ratio backside vias and low aspect ratio cavities (where e.g. a transistor unit cell chiplet can be inserted) during a single etching process (and therefor at the same time). The aspect ratio is defined as a depth to width ratio or diameter ratio, as the case may be. Typical aspect ratios are greater than or equal to 2:1.

Figure 2:
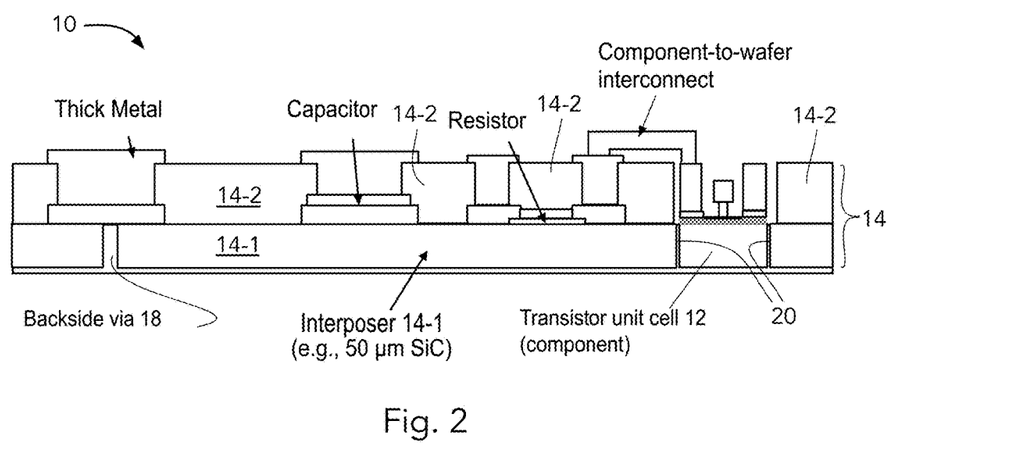
FIG. 2 is a Cross-sectional view of a MECAMIC device.

A MECAMIC device 10 can, for example, include a transistor unit cell chiplet 12 (manufactured with first materials with a first fabrication process) that is integrated into a pre-fabricated wafer 14 (manufactured with second materials using a different fabrication process) to rapidly and cost-efficiently fabricate high-performance RF circuits. For additional information, please refer to U.S. application Ser. No. 16/158,212. As outlined above, the carrier wafer can comprise integrated circuits that require through-wafer vias or backside vias 18 for electrical connection, the vias 18 having high aspect ratios; and the carrier wafer requires through-wafer cavities having low aspect ratios, for receiving the chiplets 12 to be integrated into the carrier wafer. Only one cavity 20 and one via 18 is depicted by FIG. 2 for ease of illustration, it being understood that MECAMIC device 10 may have multiple cavities 20 and many through-wafer vias and/or backside vias 18. Additionally, the MECAMIC device 10 may have resistors, capacitors and metal contacts formed therein, the details of which are not necessary to the present disclosure. The wafer 14 may include multiple layers such as a SiC interposer layer 14-1 and another layer such a dielectric (such as Benzo-Cyclo-Butane BCB) layer 14-2.

Figure 3:
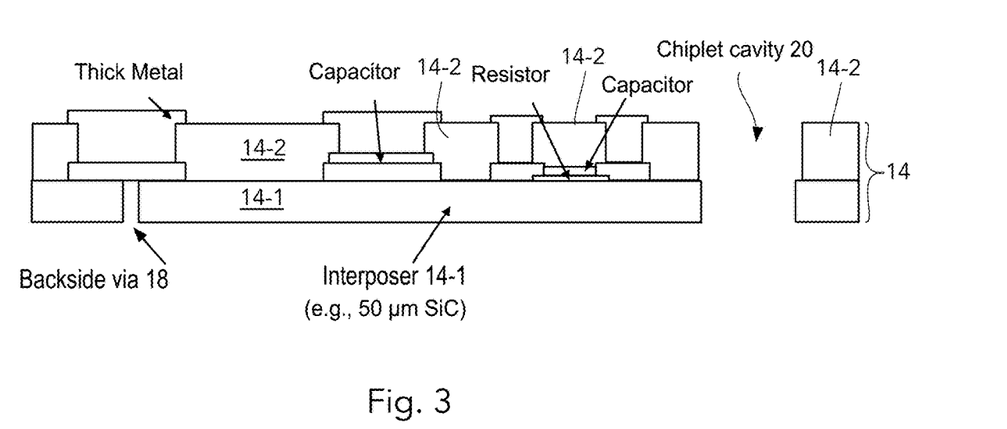
FIG. 3 is a Cross-sectional view of the interposer wafer highlighting the chiplet cavity and the backside via.

According to this disclosure, the high aspect ratio vias 18 and the low aspect ratio cavities 20 may be etched concurrently in the wafer 14 using a single etching process. FIG. 3 is a Cross Sectional view of the interposer wafer 14-1 highlighting the chiplet cavity 20 which is formed as a low aspect ratio cavity as described herein and the backside via 18 which is formed as a high aspect ratio cavity as described herein after they are formed using the a single etching process described below with reference to FIGS. 4A-4E.

The wafer 14 utilized in this embodiment has two layers 14-1 and 14-2 each of are etched with a ring shaped etch (ring 30 for layer 14-1 and ring 22 for layer 14-2 . . . see FIG. 4C) for defining the plug which is removed (see FIG. 4E) to define cavity 20 for receiving chiplet 12 (see FIG. 2). The word "ring" should not be taken literally since the resulting cavity can be of any convenient shape when viewed in a top down or plan view. See FIGS. 5-7, for example, where the ring can define either rectangular or square shapes. Round shapes or even non-geometric shapes can certainly be employed where desired. Additionally, in the two layer embodiment being presently described, the outer dimensions and widths of the rings 22 and 30 (as well as their placement on layers 14-1 and 14-2) should be carefully considered so that the plug 15 can be easily removed (as is shown by FIG. 4E).

After flipping the wafer 14 and aligning it with layer 28 such that ring pattern 22 is aligned with ring pattern 30 preferably to within three microns. FIGS. 3 and 4A-4E demonstrate the disclosed etching process in connection with a MECAMIC device 10. In particular the slope of the via sidewalls equal the slope of the sidewalls of the cavity. The MECAMIC device 10 is a fairly complicated device in that it has a number of layers associated with it and the disclosed cavity formation processing is utilized with respect to multiple layers thereof. The disclosed processing can be utilized with in simpler applications as is described later with reference to FIGS. 9A-9D, 9B-1 and 9D-1 which depicts a single wafer in which openings of various sizes are formed concurrently.

For reference, according to embodiments of this presentation backside 18 vias can be of the order of 30 μm in diameter (2:1 aspect ratio) and the cavity 20 lateral dimensions can be of the order of 300 μm to 3 mm, a 1:100 ratio between sizes. A 100× ratio (or less or greater, as desired) between cavity lateral dimension and via diameter may be obtained while maintaining the slopes of the sidewalls of a cavity and a via essentially the same (if desired). And if for some reason it is desired that the sidewall of the cavity be somewhat less vertical (a less steep slope) compared to the slopes of the via, then those slopes may be varied while still using single etching process to form the vias and a ring etch for the larger cavities.

Embodiments of this presentation relates to a design and etch process that allow:

Consistent etch rate of large cavities with small vias, independent of size, with a single etching process; and A complementary frontside design that allows for cavity opening without any planarity issues during frontside metal/dielectric processing.

Figure 4A:
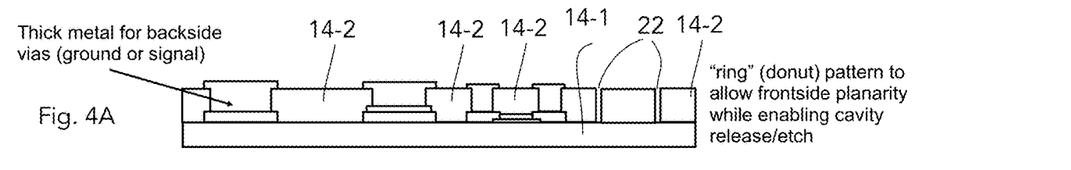
FIGS. 4A-4E illustrate one embodiment of a process flow to create small vias and large cavities concurrently during the MECAMIC process.
Figure 4B:
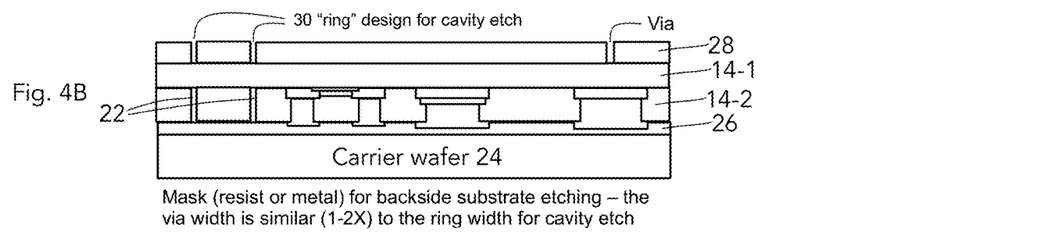
Figure 4C:
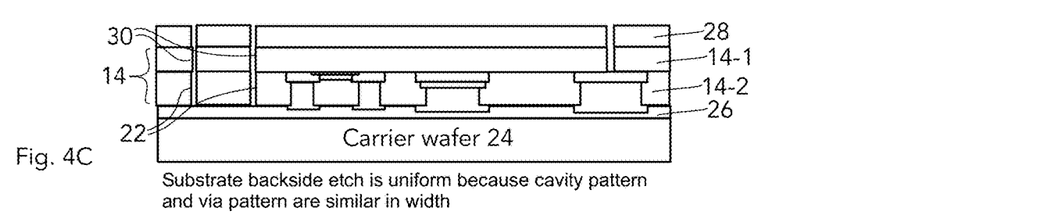
Figures 4D, 4E:
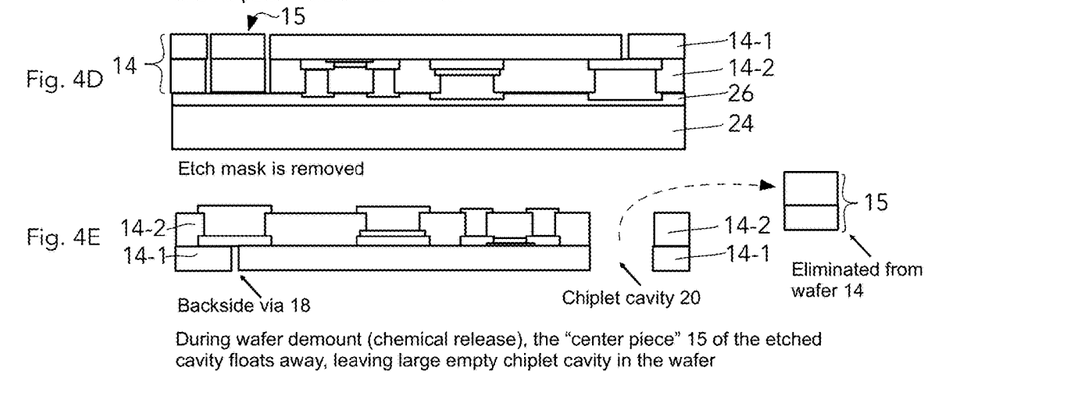

Turning now to FIGS. 4A through 4E, and according to an embodiment of this presentation, a narrow ring trench 22 is etched on the frontside of the interposer or layer 14, that matches an outer dimension or size of the desired etched cavity 20—as shown in FIG. 4A. Layer 14 may be called a wafer (if it is made of a semiconductor material, for example) or an interposer (if it is made of another material, such as a dielectric such as SiC) or some other term. In any event, layer 14 is a layer which remains in the device being fabricated after all fabrication operations have been completed. A mask (not shown) can be used to etch the ring trench 22. It should be noted that such a frontside design allows planarity issues to be avoided, thus making easier further processing steps such as thick gold frontside plating or multi-layer metal/dielectric frontside patterning.

After completing the above frontside step (where the "ring" trench 22 pattern for cavity etch remains clear of any material (metal or dielectric), the wafer 14 is mounted face down on a temporary carrier wafer 24 for backside processing, as illustrated in FIG. 4B, preferably bonding it to temporary carrier wafer 24 using a temporary bonding layer 26. A thinning of the backside of the wafer 14 can optionally be performed at this time. Then a mask 28 (resist or metal) can be patterned to allow etching both the large cavities and the small vias. To do so, once again, a "ring" trench pattern 30 is etched, this time through the layer 14-2 from the backside of the layer 14-2, until it reaches the first ring pattern 22 and forms a section (or plug) 15 of the wafer 14 that is attached only to the temporary carrier 24 by temporary bonding layer 26. During wafer demount (chemical release . . . see FIG. 4E), the plug of the etched cavity 20 floats away, leaving large empty chiplet cavity 20 in the wafer. According to an embodiment of this presentation, the vias (see via 18 for example) can be etched using the same etching process as the ring trenches 22, 30 (which allow the chiplet cavity 20 to be formed during wafer demount) through the wafer and from the backside of the wafer 14 through layer 14-1. The ring trench width (for trenches 22 and 30) is on the order of the via width to maintain consistent etch rate. According to an embodiment of this presentation, the ring trench width is preferably between 0.5 and 2× of the via width.

Figure 5:
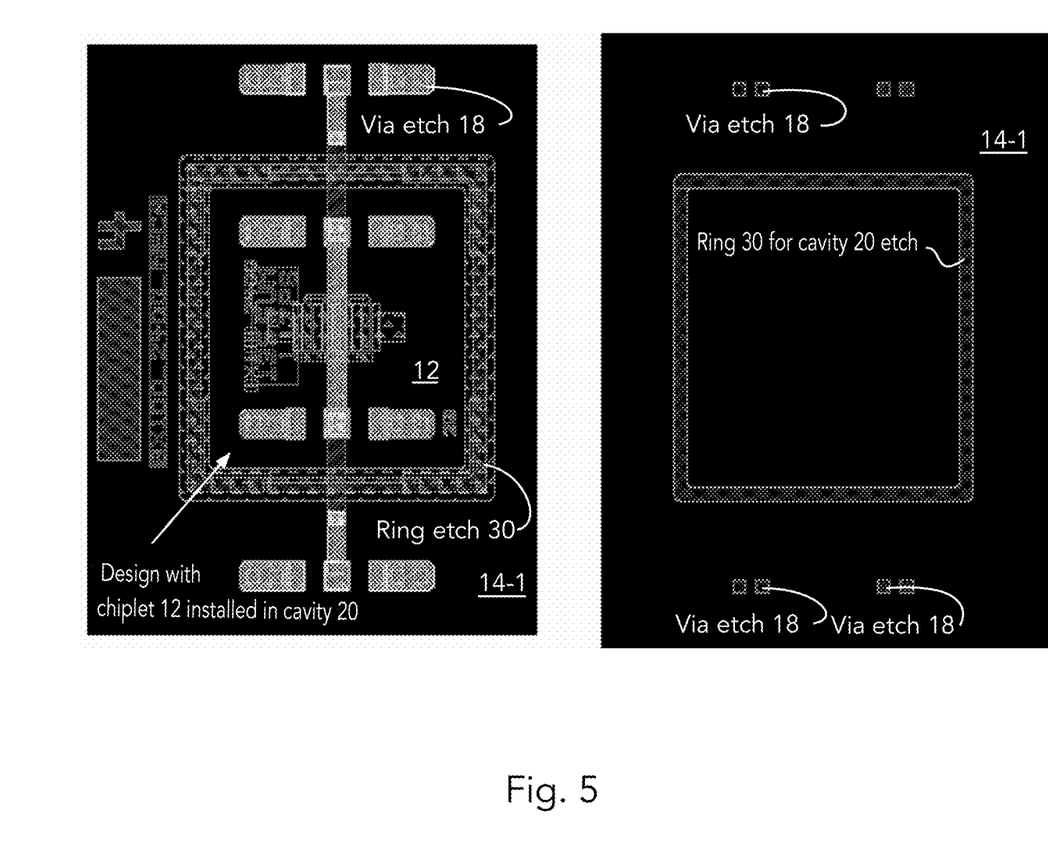
FIG. 5 is a Design example of a test RF transistor in the MECAMIC process. The design shows the cavity and via etch designs.

According to an embodiment of this presentation plasma dry etch can be used to etch the ring trench and the vias and the trenches can be etched at a uniform etch rate (see FIG. 4C). The mask (if any) can then be removed (FIG. 4D). FIG. 5 shows top and bottom views of a MECAMIC device design integrating a RF transistor.

FIG. 5 is a design example of a test RF transistor in the MECAMIC process. The design shows the cavity and via etch designs.

Figure 6:
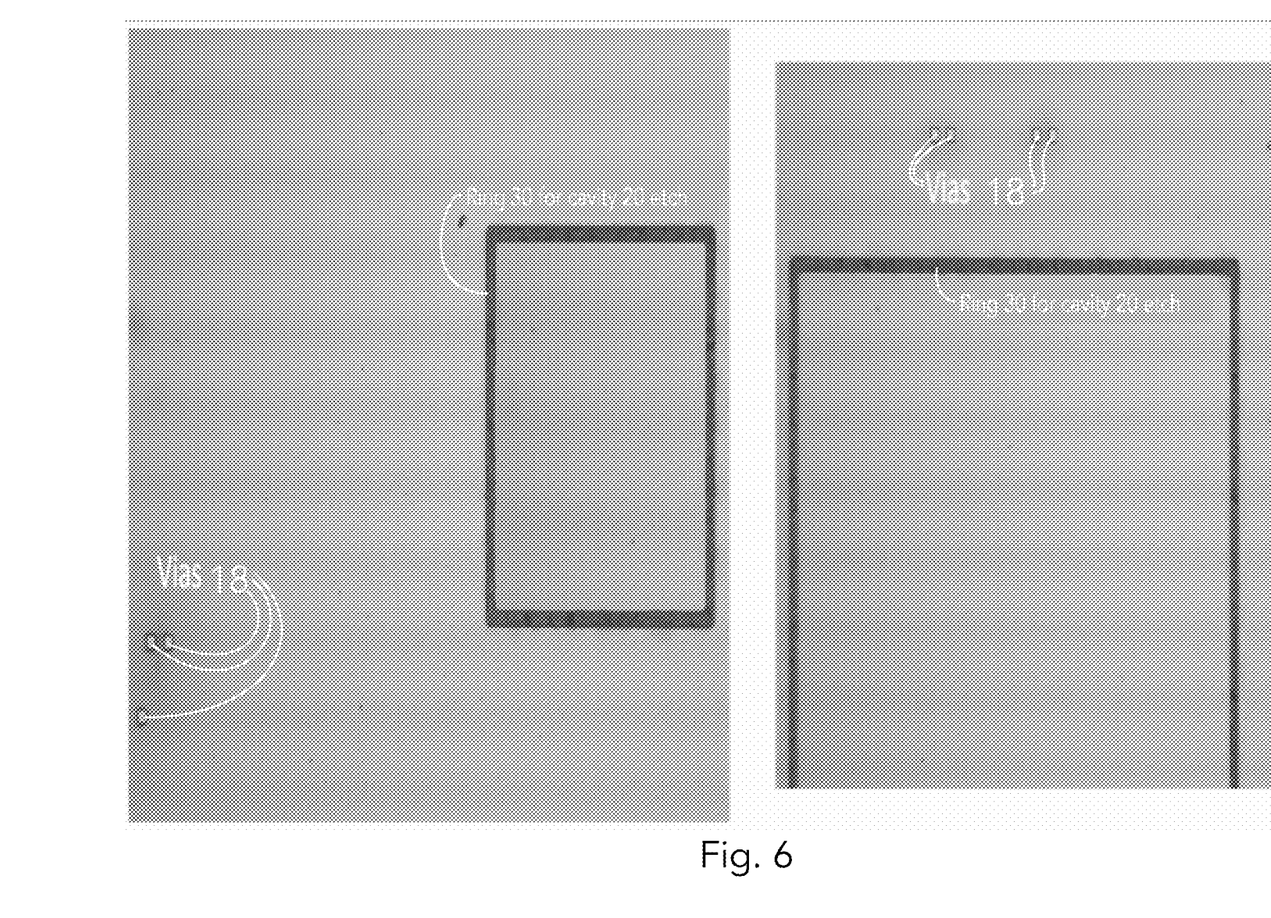
FIG. 6 includes two microscope photos after via etch (nickel hard mask). The vias and the rings are cleanly etched down to the frontside.

FIG. 6 presents pictures of two examples of the result of the back-etch step according to this presentation. As one can see, the via 18 (down to the frontside metal) and the ring pattern 30 for the cavity (down to the bonding adhesive material) are well defined and cleanly etched.

Figure 7:
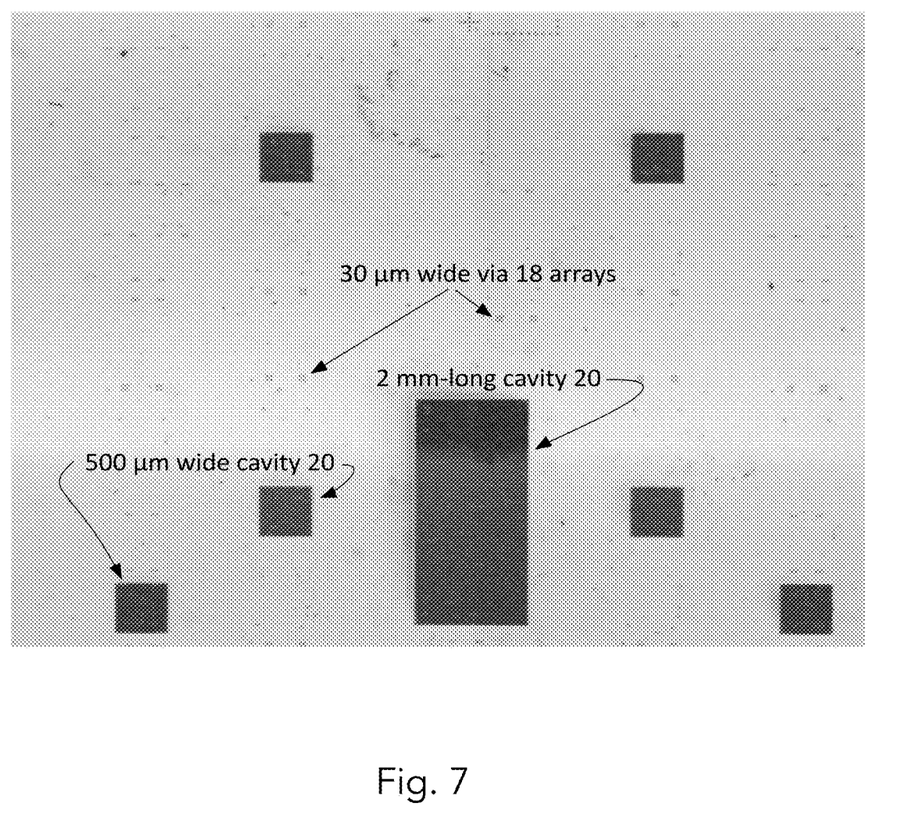
FIG. 7 is a backside microscope photo with small vias and large cavities (fully opened).
Figure 8:
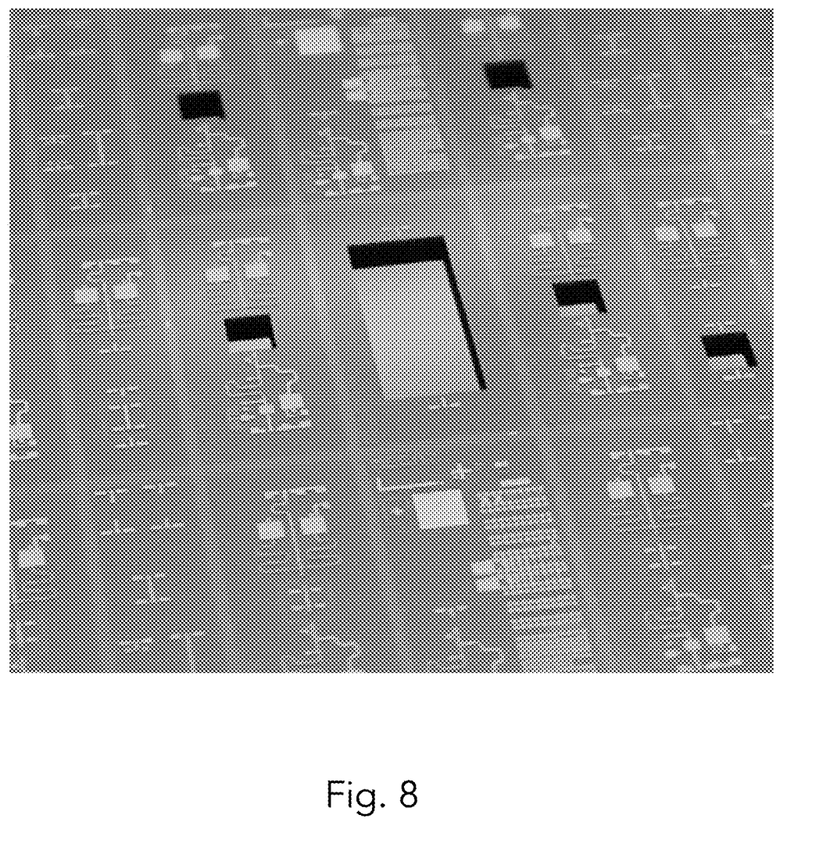
FIG. 8 is a photo of the frontside of the wafer after flipping it.

Finally, according to embodiments of this presentation, the wafer is released from the carrier through a chemical process and flipped face up (see FIG. 4E). During the chemical release, the "center cavity" pieces are also removed (since they are now only being held by the adhesive of the carrier wafer). The pieces are washed away by the chemical used to remove the adhesive. Typical adhesive is wax and the corresponding solvent is heated PerChloroEthylene PCE. The pieces are separately harvested or removed but not used in the later processing steps. More importantly, removal of the "center pieces" leads to formation of the large cavities. FIG. 7 shows additional images after removal of the "center" pieces. FIG. 8 shows frontside view after flipping the wafer.

It is noted that the remaining process steps to fabricate MECAMIC devices are described in U.S. application Ser. No. 16/158,212 noted above.

FIGS. 4A-4E depict an embodiment of a process flow to create small vias and large cavities during, for example, a MECAMIC fabrication process. The FIGS. 9A-9D (with FIGS. 9B-1 and 9D-1) will now described depicting an embodiment of the disclosed process used in connection with a wafer 94, which need not be a wafer used in the MECAMIC fabrication process. So it should be clear that the presently described technology can be used any wafer or substrate, such as the semiconductor wafer 94 depicted by FIGS. 9A-9D, 9B-1 and 9D-1.

Figure 9A:
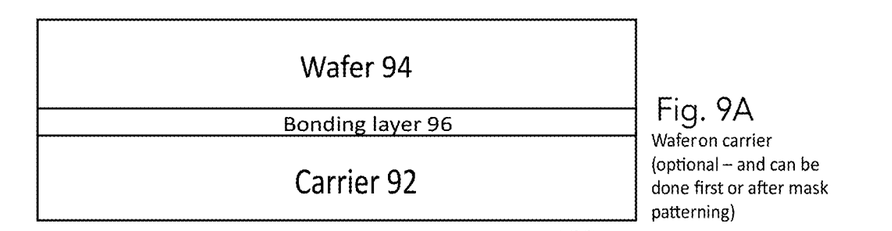
Figure 9B:
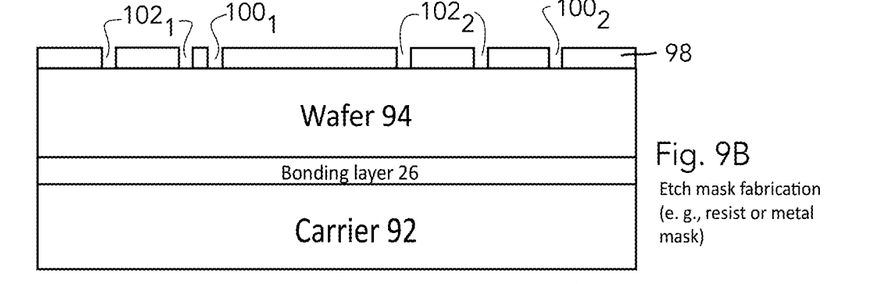

As is depicted by FIG. 9A, semiconductor substrate or wafer 94 is temporarily bonded to a carrier 92 by means of an adhesive layer 96. The semiconductor substrate or wafer 94 is covered with a mask layer 98 which is which is patterned with relatively large openings, defined by ring trenches $100_1$ and $100_2$, and relatively small openings or vias $102_1$ and $102_2$ as depicted by FIGS. 9B and 9B-1. The ring trenches of the relatively large openings $100_1$ and $100_2$ have a outer peripheral edge which will define the eventual sizes of the relatively large openings $108_1$ and $108_2$ when fully etched (see also FIG. 9D-1).

The substrate or wafer 94 may alternatively be temporarily bonded to carrier 92 by means of adhesive layer 96 after the mask layer 98 is formed or after the mask layer 98 has been both formed and patterned. Patterning a mask, such as mask layer 98, is well known in the semiconductor fabrication art and therefor not described here.

Figure 9B:
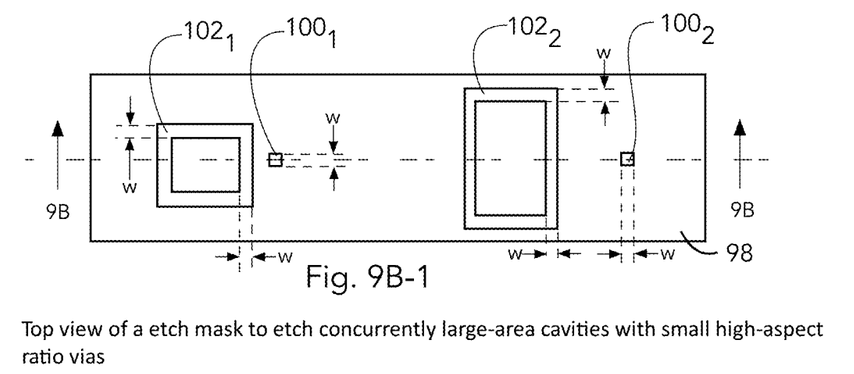
Figure 9C:
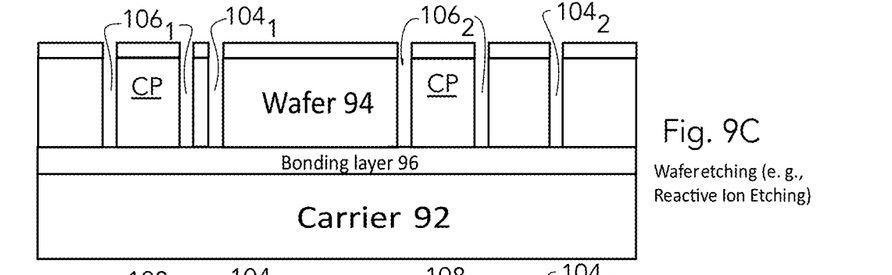

With the wafer 94 temporarily bonded to carrier 92, is it etched (see FIG. 9C) using an etching process such a Reactive Ion Etching (REI). Of course, the mask layer 98 resists this etching process while the wafer 94 does not, so openings $104_1$, $104_2$, $106_1$ and $106_2$ are created concurrently in the the wafer 94 which follow the shapes of the openings $100_1$ and $100_2$ and $102_1$ and $102_2$. previously formed in the mask 98. The etch preferably completely penetrates the wafer 94 as is depicted by FIG. 9C.

Figure 9D:
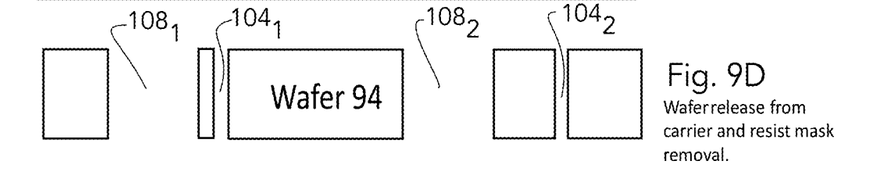
Figure 9D:
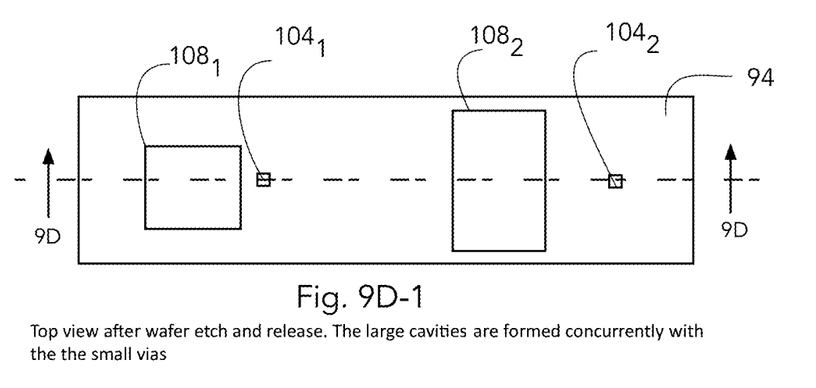

The adhesive layer 96 and the mask layer 98 are removed (dissolved), using a technique or techniques well known in the semiconductor fabrication art, leaving the wafer 94 separated therefrom as shown by FIGS. 9D and 9D-1. Since the central portions CP inside the peripheral edges of openings $106_1$ and $106_2$ of the wafer 94 are not supported by the remaining portion of the wafer 94, they are allowed to fall away when the adhesive layer 96 is removed.

The relatively larger openings $102_1$ and $102_2$ in mask 98 are depicted with a rectilinear shape, but the may assume whatever shape is needed by the user of this technology. The relatively larger openings $102_1$ and $102_2$ in mask 98 have and the relatively smaller openings or vias $100_1$ and $100_2$ in mask 98 each preferably have a common width w. As such, the resultant sidewalls of relatively large openings $106_1$ and $106_2$ in wafer 92 and the resultant sidewalls of the relatively smaller openings or vias $104_1$ and $104_2$ in substrate or wafer 92 will preferably enjoy essentially the same amount of verticalness. That is, the sidewalls of the openings $106_1$ and $106_2$ and $104_1$ and $104_2$ in substrate or wafer 92 preferably will have essentially exhibit the same angle with respect to a major surface of the substrate or wafer 92. Those sidewalls are depicted as being vertical in FIGS. 9C and 9D, but those walls will have, in reality, a small angular divergence from vertical due to the etching aspect ratio problem discussed above with reference to FIG. 1. But since all these openings started with an initial etch width equal to W, both the relatively large aspect openings (such as vias $104_1$ and $104_2$) and the relatively low aspect openings (such as opening $106_1$ and $106_2$) end up with sidewalls having essentially the same amount of verticalness.

The width w may differ somewhat for the various openings or even for various portions of the openings, should it be desirable to vary the angle of the sidewalls. But using the techniques disclosed herein will allow the angle of the sidewalls to be controlled while using a single etching process to form both relatively large aspect ratio openings (such as vias $104_1$ and $104_2$) and relatively low aspect ratio openings (such as opening $106_1$ and $106_2$) concurrently. Preferably, the width of the ring trench varies between 0.5 w and 2 w compared to a width w of the via opening (or compared with other portions of ring trench) even though all are shown with a width w in FIG. 9B-1.

For reference, according to embodiments of this presentation vias $104_1$ and $104_2$ in the case of the embodiment of FIGS. 9A-9D, 9B-1 and 9D-1, can be of the order of 30 μm in width W (with 2:1 aspect ratio) and the cavities $108_1$ and $108_2$ lateral dimensions can be of the order of 300 μm to 3 mm, a 1:100 ratio between sizes (or even greater if desired).

A 100× ratio between cavity lateral dimension and via size W is certainly possible (and even greater if desired) while maintaining the slope of the sidewalls the same or close to the same for both relatively small vias $104_1$ and $104_2$ and relatively big cavities $108_1$ and $108_2$ if the relatively big cavities $108_1$ and $108_2$ are formed using the ring etch $106_1$ and $106_2$ disclosed herein (the numbering in this paragraph refers to the embodiment of FIGS. 9A-9D, 9B-1 and 9D-1 but these concepts are equally applicable to the embodiment of FIGS. 2, 3, and 4A-4E). The slope of the sidewalls of both relatively small vias $104_1$ and $104_2$ and relatively big cavities $108_1$ and $108_2$ will be essentially the same if the width W of the openings $100_1$ and $100_2$ in mask 98 for the relatively small vias $104_1$ and $104_2$ and width W of the openings $102_1$ and $102_2$ in mask 98 for the ring etch made for the relatively big cavities $108_1$ and $108_2$ are the same value. If it is desired that the slope of sidewalls of the relatively big cavities $108_1$ and $108_2$ be greater (less vertical), then the value of W for the width of the ring etch opening in mask 98 should then be greater than the value selected for the dimension W for the width of the via openings in mask 98 for making the relatively small vias $104_1$ or $104_2$. Increasing the value of W for the ring etch for making the relatively big cavities $108_1$ and $108_2$ will increase the lateral etch rate thereby increasing their vertical slopes accordingly. Is is assumed in FIG. 9B-1 that the widths W of the openings $102_1$ and $102_2$ in the etch mask 98 on all four sides of the resulting cavities $108_1$ and $108_2$ will be the same value W. But that need not be the case. Those widths may vary if desired and indeed the shapes of the of the cavities $108_1$ and $108_2$ need not be rectilinear as depicted. Any convenient shape (geometric or otherwise) may be used when convenient to do so and such a convenient shape can certainly be formed using the ring etching disclosed herein.

It should now be apparent that the disclosed technology may be used to form relatively large aspect ratio openings and the relatively low aspect ratio openings concurrently during a single etching process in a substrate or wafer described with reference to FIGS. 9A through 9D-1 or in a layer of multiple layer device such as the MECAMIC device described with reference to FIGS. 4A through 4E.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step (s) of . . . ."

All elements, parts and steps described herein are preferably included. It is to be understood that any of these elements, parts and steps may be replaced by other elements, parts and steps or deleted altogether as will be obvious to those skilled in the art.

What is claimed is:

1. A method comprising: providing a wafer comprising: a substrate having a substrate top surface and a substrate bottom surface; an integrated circuit formed in said substrate and comprising at least one conductive line; and a top layer covering said substrate top surface; etching, through said top layer and down to said substrate top surface, a first ring trench that defines a predetermined perimeter; attaching a carrier wafer to a top surface of said top layer; etching through the substrate at least: a second ring trench having said predetermined perimeter, that extends from said substrate bottom surface to said first ring trench, thus forming a portion of the wafer inside said perimeter that is attached to said carrier wafer only; and a first via that extends from said substrate bottom surface to said at least one conductive line; and removing said carrier wafer, along with said portion of the wafer inside said perimeter.

2. The method of claim 1 further including thinning the substrate on the side of said substrate bottom surface before etching said second ring trench and first via.

3. The method of claim 1 further including forming an etching mask on said substrate bottom surface before etching said second ring trench and first via.

4. The method of claim 1 further including filling said first via with a conductive material.

5. The method of claim 1 further wherein said first via has a width and a height, and said perimeter has a length, a width and a height; the length of the perimeter being larger than twice the width of said first via and the the width of the perimeter being no larger than twice the width of said first via.

6. The method of claim 1 wherein the width of said first via is at most half the height of said first via.

7. The method of claim 1 wherein at least one of the length and the width of the perimeter is comprised between 5 times and 100 times the width of said first via.

8. The method of claim 1 wherein the width of said first via is 30 micrometers.

9. The method of claim 1 wherein conducting said etching through the substrate using a plasma dry etch.

10. The method of claim 1 wherein said substrate is a SiC substrate.

11. The method of claim 1 where the carrier wafer is temporarily bonded to the top surface of said top layer by a temporary bonding layer and wherein the carrier wafer is removed by chemical release from the top surface of said top layer.

12. A method comprising: providing a wafer with: a substrate having a substrate top surface and a substrate bottom surface, and an integrated circuit formed on or in said substrate and comprising at least one conductive line; attaching a carrier wafer to a top surface of said substrate top surface; etching a first ring trench having a predetermined perimeter, that extends from said substrate bottom surface to said substrate top surface, thus forming a portion of the wafer inside said perimeter that is attached to said carrier wafer only; and a first via that extends from said substrate bottom surface to said at least one conductive line; and removing said carrier wafer, along with said portion of the wafer inside said perimeter.

13. The method of claim 12 where the carrier wafer is temporarily bonded to the top surface of said top layer by a temporary bonding layer and wherein the carrier wafer is removed by chemical release from the top surface of said top layer.

14. The method of claim 12 wherein a top layer covers said substrate top surface; the method further comprising, before said attaching a carrier wafer to a top surface of said top layer, etching through said top layer and down to said substrate top surface, a second ring trench above said predetermined perimeter.

15. The method of claim 12 further including thinning the substrate on the side of said substrate bottom surface before etching said first ring trench and first via.

16. The method of claim 12 further including forming an etching mask on said substrate bottom surface before etching said first ring trench and first via.

17. The method of claim 12 wherein the first via has a width and a height, and wherein said perimeter has a length, a width and a height; the length and the width of the perimeter being each larger than twice the width of said first via.

18. A method comprising: providing a wafer with a substrate having a substrate top surface and a substrate bottom surface; attaching a carrier wafer to said substrate top surface; etching through the substrate at least a ring trench having a predetermined perimeter, the ring trench extending from said substrate bottom surface towards said substrate top surface, thus forming a portion of the substrate inside said perimeter that is attached to said carrier wafer only; and removing said carrier wafer, along with said portion of the substrate inside said perimeter.

19. The method of claim 18 wherein a top layer covers said substrate top surface; and the method comprises, before said attaching the carrier wafer to the top surface of said top layer, etching through said top layer and down to said substrate top surface another ring trench that meets the first-mentioned ring trench.

20. The method of claim 18 wherein, at the same time as said etching the ring trench through the substrate, further including etching through the substrate a via that extends from said substrate bottom surface to at least one conductive line disposed on or in said substrate.

21. The method of claim 20 further including thinning the substrate on the side of said substrate bottom surface before etching said ring trench into said substrate.

22. The method of claim 20 further including forming an etching mask on said substrate bottom surface before etching said first trench.

23. A method of forming concurrently, in a substrate or wafer or a portion of a substrate or wafer, openings therein where at least one of the openings has a first aspect ratio and another one of the openings has a second aspect ratio, the first aspect ratio being greater than the second aspect ratio, the method comprising:
bonding said substrate or wafer or a portion of the substrate or wafer to a carrier substrate;
forming a ring trench in said substrate or wafer or in a portion of the substrate or wafer, the ring trench having an outer perimeter that corresponds to an outer perimeter of the another one of the openings having said second aspect ratio and thereby defining a plug of material spaced from said substrate by said ring trench and disposed inwardly of said ring trench;
forming an opening in said substrate or wafer or in a portion of substrate or wafer having said first aspect ratio concurrently with said forming of said ring trench; and
separating said substrate or wafer or a portion of substrate or wafer from (i) said carrier substrate and (ii) said plug of material.

24. The method of claim 23 wherein the at least one of the openings having said first high aspect ratio is deeper than it is wide and the another one of the openings having said second low aspect ratio is wider than it is deep.

25. The method of claim 23 wherein the carrier substrate is temporarily bonded to the substrate or wafer or a portion of the substrate or wafer by a temporary bonding layer and wherein the carrier wafer is separated from said substrate or wafer or a portion of substrate or wafer by chemical release therefrom.

26. The method of claim 23 wherein the ring trench as a width that is between 0.5 and 2 times a width of said opening.

27. The method of claim 23 wherein the width of the opening is on the order of 30 μm.

* * * * *